United States Patent [19]

Gates et al.

[11] Patent Number: 4,870,616
[45] Date of Patent: Sep. 26, 1989

[54] COMPACT REGISTER SET USING A PSRAM ARRAY

[75] Inventors: Dennis E. Gates, Wichita; Keith B. DuLac, Derby, both of Kans.

[73] Assignee: Maryland, Dayton, Ohio

[21] Appl. No.: 102,075

[22] Filed: Sep. 29, 1987

[51] Int. Cl.[4] .............................................. G11C 7/00
[52] U.S. Cl. ......................... 365/189.05; 365/230.08; 365/233
[58] Field of Search ...................... 365/189, 233, 230

[56] References Cited

U.S. PATENT DOCUMENTS

| | | | |
|---|---|---|---|
| 4,500,974 | 2/1985 | Nagami | 365/230 |
| 4,586,166 | 4/1986 | Shah | 365/154 X |
| 4,636,985 | 1/1987 | Aoki et al. | 365/189 X |
| 4,651,237 | 3/1987 | Williams | 360/48 X |
| 4,809,233 | 2/1989 | Takimae | 365/230 |

Primary Examiner—Stuart N. Hecker
Assistant Examiner—Alfonso Garcia
Attorney, Agent, or Firm—Wilbert Hawk, Jr.; Edward Dugas; Jack R. Penrod

[57] ABSTRACT

A compact register file circuit, especially valuable for CMOS VLSI circuits used with microcontrollers, which uses a pseudo static random access memory array circuit, a latch array circuit, and a decoder circuit to provide almost identical characteristics as available with a much larger static random access memory as a register set. The only differences visible to the user during a read operation is the requirement of keeping the address data value constant during the active portion of the pseudo static random access memory chip select waveform.

3 Claims, 1 Drawing Sheet

COMPACT REGISTER SET USING A PSRAM ARRAY

BACKGROUND OF THE INVENTION

The present invention is a compact register set using a pseudo-static random access memory array and a set of latches for use in a VLSI, high speed disk controller application in conjunction with a microcontroller or a microprocessor.

Registers for a high speed disk controller application, whether internal or external to the controller integrated circuit, typically are implemented in a static random access memory (SRAM) array. This is because a SRAM has some very desirable characteristics. Data can be written to or read from a SRAM with a minimal amount of set up time before the information on the address lines and the data lines can be used by the SRAM array internal control circuits. Additionally, on a read from memory, once the address lines are read into the SRAM internal control circuits and the chip select line becomes inactive, further changes to the address lines will not affect the output data. The problem with SRAMs and SRAM arrays is the physical size required for each of the memory elements which make up a memory word location. If this were not the case, SRAMs would be more widely used for main memory applications instead of the dynamic RAMS which have a much smaller memory element size, but also have slower data access times.

A simpler and smaller variation of the SRAM does exist and, because it does not have all of the same characteristics of a SRAM, is designated as a pseudo-static RAM (PSRAM). The memory element of this PSRAM uses interconnected CMOS transistors in the familiar flip-flop type of positive feedback configuration used in SRAMs, but the transistors used are physically smaller. The smaller size of the transistors does increase the desirability of such a memory, since it takes up less semiconductor chip area. Unfortunately, it also reduces the gain of those transistors, thereby reducing the overall switching performance. Partly because of the reduced performance and partly to reduce the overall size of a PSRAM memory element, the input/output circuits are simplified with respect to the input/output circuits of a SRAM array. The input/output simplification consists of using only a single transistor to interface each memory element to the column line associated with its respective bit position. In a read operation, each of the column lines is pre-charged by a CMOS switch and each memory element of the addressed word etiher keeps its output at the precharge level if that element is in the RESET state, or pulls the column line to a low level if the element is in the SET state. Each column line level is connected to an inverting buffer amplifier which ultimately provides the output. The problem with this type of PSRAM array circuit has been that, unlike the SRAM array, if the value on the address lines of the addresses bus change, the subsequently addressed location of the PSRAM array will have its memory elements drive the column lines too. Since the output of each element is wire-or'ed with the other bits of the same bit position, the resulting data output will be the same where the value stored in the locations are equal, but the pulled down level will dominate where there is a difference of the two data words. After a column line has been precharged and pulled down, there is no mechanism in the PSRAM circuit for restoring the column line to a high level except by a further precharge cycle. The susceptibility to changes on the address bus and the resulting jumbling of data that can occur has caused the PSRAM array to find limited application as a replacement for a SRAM array.

It is an object of this invention to provide a circuit arrangement which occupies less semiconductor area per memory location than equivalent SRAM registers.

It is another object of this invention to provide a circuit arrangement which holds its data output to the value accessed by the last valid address on the address bus.

It is a further object of this invention to provide a circuit arrangement which from the output characteristics thereof appears to the microcontroller or microprocessor as a SRAM array.

SUMMARY OF THE INVENTION

A register file circuit for storing a plurality of words, each having a plurality of bits, including: a pseudo static RAM device for storing the plurality of words in a plurality of memory locations; an address bus device connected to the pseudo static RAM device for independently addressing each of the plurality of memory locations; a latch device having an input connected to the output of the pseudo static RAM device for latching into the latch device one of the plurality of words appearing at the output of the pseudo static RAM device; a clock device connected to the pseudo static RAM device to clock one of the plurality of words out of its respective memory location; the clock device is also connected to the latch device for clocking one of the plurality of words appearing at the output of the pseudo static RAM device into the latch device; a first enabling device for enabling a read from one of the plurality of memory locations of the pseudo static RAM device; and a second enabling device for enabling the latch device to connect the one of the plurality of words latched therein to the latch output.

BRIEF DESCRIPTION OF THE DRAWING

While the specification concludes with claims particularly pointing out and distinctly claiming the subject matter which is regarded as the invention, it is believed that the invention will be better understood from the following description of the preferred embodiment taken in conjunction with the accompanying drawings in which:

DESCRIPTION OF THE PREFERRED EMBODIMENT

Figure 1:
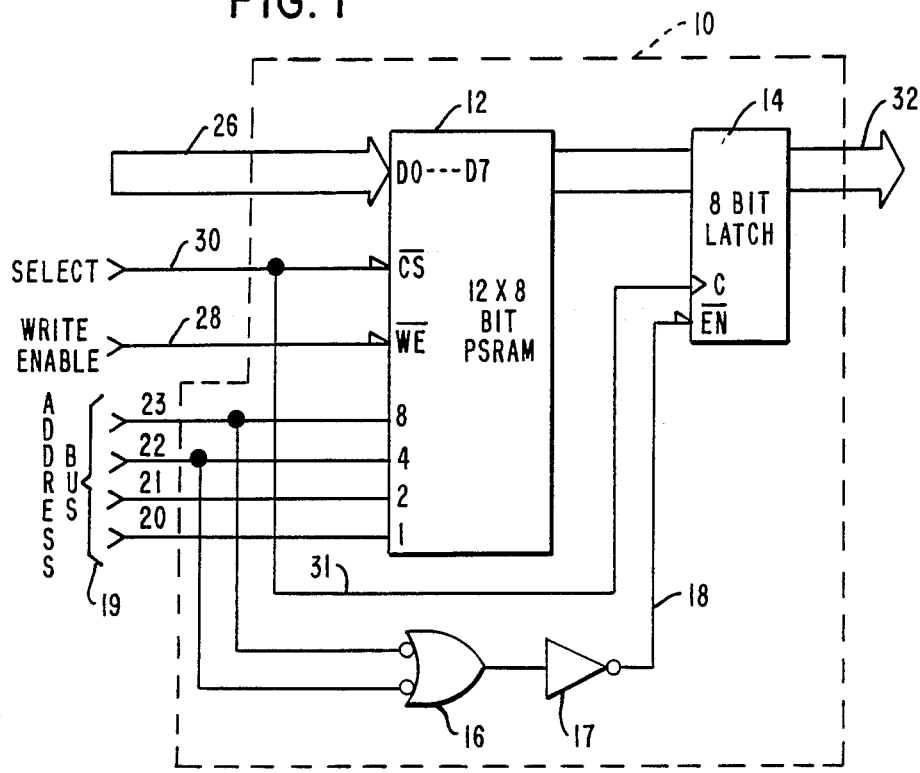
FIG. 1 is a functional block diagram of one embodiment the invention.

In FIG. 1, the preferred circuit for a register set 10 according to the present invention is illustrated. The register set 10 is comprised of a pseudo-static random access memory (PSRAM) array 12, an eight-by-one, edge triggered latch array 14, a two input NAND gate 16, and an inverting gate 17. The register set 10 has an address bus 19 comprised of four parallel bit lines 20, 21, 22, and 23; an eight bit parallel input data bus 26; a write enable line 28; and a chip select line 30 all connected to their respective inputs of the PSRAM array 12. These lines make the register set 10 appear the same as a static random access memory (SRAM) array with respect to the number and type of input lines.

The register file 10 also has an eight bit parallel output bus 32 connected to the output of the latch array 14. The eight bit parallel input to the latch array 14 is clocked and latched into memory with a positive going pulse edge on the clock input line from the microcontroller system clock (not shown). The output of the latch array 14 is of the three state type which means the output is a value corresponding to the value in the latch memory when an enable line 18 is at a low level, or is essentially disconnected by a high impedance state when the enable line 18 is at a high level. This arrangement of the latch array 14 provides the register set with the same characteristics as a SRAM output bus. Thus the resulting register set 10 has a high degree of similarity to the larger SRAM register file that it is to replace.

The main differences between the register set 10 and a comparable SRAM register set occur within the dashed lines of FIG. 1. These main differences are related to the simplification of the output circuitry of the PSRAM array 12 with respect to a SRAM output circuitry already discussed in the background portion of this application. As mentioned previously, in the PSRAM 12 some of the transistors which appear in a SRAM are eliminated and others are reduced in size. The result is a smaller but more demanding register set 10. Each of the column lines of the PSRAM array 12 is connected to twelve memory elements corresponding to twelve similarly situated bits from twelve, respective one-byte word locations. During a read from memory or a write to memory operation, as soon as the microcontroller clock goes inactive, i.e. to a high level, the column lines are precharged to a high voltage. After this precharging, the address value on the address bus 19 is decoded by stardard decoder circuits in the PSRAM array 12 and selects the memory location corresponding to the address value for reading from memory when a write enable line 28 connected to the write enable input of PSRAM array 12 is driven to a high level (see FIG. 2), and provided that the chip select line 30 connected to the chip select input of PSRAM array 12 is driven to a low level also (see FIG. 2). If all these conditions are met, then the value in the addressed memory location will appear at the output of the PSRAM array 12. However, should the value on the address bus 19 change, while the chip select is still at a low level, the information at the output may change and be an invalid jumbled combination of the two memory locations which were addressed.

To get around this problem, the invention has two special provisions: first, it requires the value on the address bus 19 to be held constant for the low portion of the microcontroller clock waveform connected to the chip select input of PSRAM array 12 (see FIG. 2); and second, it adds a latch 14 and related logic gates 16, 17, which guarantee the latching of the output valve of the PSRAM array 12 into the latch array 14 at the end of the active portion, i.e., low portion of the microcontroller clock waveform connected to the chip select input, by having the positive going edge of the microcontroller clock at the end of the chip select cycle edge trigger the output of the PSRAM array 12 into the latch array 14. Once latched in, the value will stay there until overwritten. However, because of the "decoder" action of a composite AND gate, which is provived by the NAND gate 16 followed by the inverter gate 17, the contents of the latch can only be read when a valid address is appearing on the address input lines (not necessarily the address of the data in the latch at this moment). This fact must also be taken into account when using the register set 10. At all other times the value stored in the latch array 14 is disconnected by the high impedance state of its three state output which is induced by the output of the NAND gate 16 and the inverter gate 17.

Figure 2:
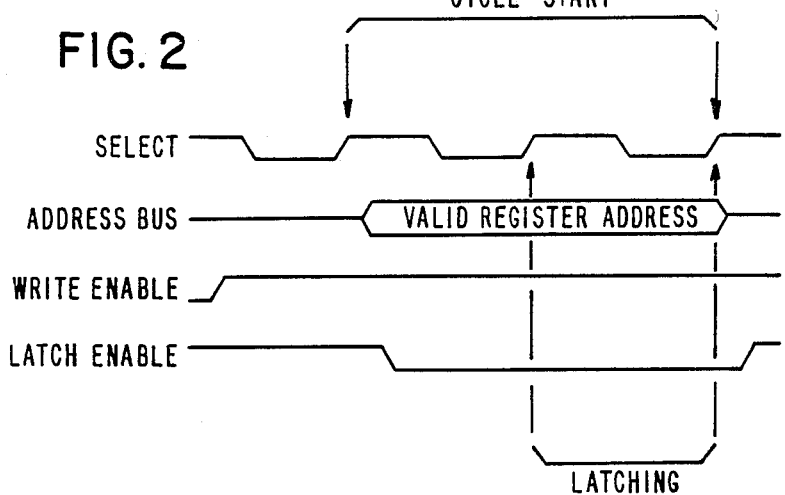
FIG. 2 is a timing diagram illustrating the sequence of externally supplied and internally supplied signals for a read-from-memory operation.

Referring now to FIGS. 1 and 2, in operation the chip select input of PSRAM array 12 and the clock input of the latch array 14, which are connected together, are driven by the microcontroller clock which provides the time base for all synchronous microcontroller operations with the register set 10. For a read from PSRAM array 12, the write enable line 28 is driven high as shown. During the inactive, i.e. high portion of the microcontroller clock, the column lines of PSRAM array 12 precharge in anticipation of the read operation. Also during this inactive portion of the microprocessor clock, a valid address is impressed upon the address inputs of PSRAM array 12 via the address bus 19. After two gate delays, a valid address decoded by NAND gate 16 and inverter gate 17 will enable, i.e. connect, the output of the latch array 14 to the output bus 32. Now, when the microcontroller clock pulls the chip select line 30 to a low level, the memory word in the location addressed by the information on the address bus 19 is read from the previously precharged column lines to the output of the PSRAM array 12. As long as the address on the address bus does not change (one of the special operating requirements) while the clock is still low, the latch array 14 will latch the correct value as the microcontroller clock rises since the latch array 14 is a positive edge triggered latch. Once the clock has gone high, the read from memory cycle is over, and the data in the latch array 14 is fixed for the next microcontroller clock cycle. These are exactly the SRAM characteristics desired.

Thus, it will now be understood that there has been disclosed a new and compact register set circuit using a PSRAM array which provides comparable performance to the larger SRAM register set that it replaces.

As will be evident from the foregoing description, certain aspects of the invention are not limited to the particular details of the example illustrated, and it is therefore contemplated that other modifications or applications will occur to those skilled in the art, such as variations in the gate combinations for the latch enable decoder, it is accordingly intended that the claims shall cover all such modifications and applications which do not depart from the true spirit and scope of the invention.

We claim:

1. A register set circuit for storing a plurality of words, each word having a plurality of bits, comprising:
    pseudo static RAM means having a plurality of memory locations for storing the plurality of words therein;
    address bus means connected to the pseudo static RAM means for independently addressing each of the plurality of memory locations;
    latch means having an input connected to an output of the pseudo static RAM means for latching into the latch means a word appearing at the output of the pseudo static RAM means;
    clock means connected to the pseudo static RAM means to clock one of the plurality of words stored in the pseudo static RAM means out of its respective memory location to the output of the pseudo static RAM means;

the clock means is further connected to the latch means for clocking each word clocked to the output of the pseudo static RAM means into the latch means;

a first enabling means for enabling a read from one of the plurality of memory locations of the pseudo static RAM means; and a second enabling means for enabling the latch means to connect the word latched therein to the latch output.

2. A register set circuit for storing a plurality of words, each having a plurality of bits, comprising:

a pseudo static RAM including:

an address input having a plurality of connections for independently addressing each of the plurality of words and at least one address which does not address any of the plurality of words, a data input having a number of parallel connections equal in number to the plurality of bits for inputting all of the bits from one of the plurality of words concurrently;

a data output having a number of parallel connections equal in number to the plurality of bits for outputting all of the bits of one of the plurality of words concurrently;

a plurality of memory locations equal in number to the plurality of words, each of the memory locations for storing a respective word;

a select input allowing the reading of the respective word from the memory location addressed by the address input; and a write enable input, enabling, when at a high level, the reading of the respective word from the memory location addressed by the address input;

a latch including:

a latch input having a number of parallel connections equal in number to the plurality of bits;

a latch output having a number of parallel connections equal in number to the plurality of bits;

a plurality of latch elements equal in number to the plurality of bits;

a clock input for storing the data at the latch input when the clock input goes from a low level to a high level; and an enable input, connecting the plurality of latch elements to the latch output when at a low level and disconnecting the plurality of latch elements from the latch output by a high impedance when driven at a high level;

an input bus connected at one end to the data output;

an internal bus connecting each of the data outputs to a respective latch input;

an latch output bus connected at one end to the latch output;

a line connecting the select input of the pseudo static RAM to the clock input of the latch;

an AND gate having at least two inputs for determining a valid address connected to two lines of the address bus; and an output of the AND gate connected to the enable gate, connecting the latch elements to the latch output only when a valid address has been determined on the address bus.

3. The register file circuit as set forth in claim 2, wherein:

the AND gate is the serial combination of a two input NAND gate followed by an inverting gate.

* * * * *

UNITED STATES PATENT AND TRADEMARK OFFICE
CERTIFICATE OF CORRECTION

PATENT NO. : 4,870,616

DATED : September 26, 1989

INVENTOR(S) : Dennis E. Gates et al.

It is certified that error appears in the above-identified patent and that said Letters Patent is hereby corrected as shown below:

On the front page of the patent, after Assignee:, delete "Maryland" and substitute --NCR Corporation--.

Signed and Sealed this

First Day of January, 1991

Attest:

HARRY F. MANBECK, JR.

*Attesting Officer*  *Commissioner of Patents and Trademarks*